United States Patent
Geil et al.

(10) Patent No.: US 6,650,260 B1
(45) Date of Patent: Nov. 18, 2003

(54) PARALLEL TO SEQUENTIAL MESSAGE CONVERTER

(75) Inventors: Frederick G. Geil, Annapolis, MD (US); Joseph F. Paroulek, Chester, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/261,590

(22) Filed: Oct. 2, 2002

(51) Int. Cl.[7] .............................................. H03M 9/00
(52) U.S. Cl. ...................................... 341/101; 341/100
(58) Field of Search ................................ 341/101, 100, 341/159, 102, 160

(56) References Cited

U.S. PATENT DOCUMENTS 5,959,559 A * 9/1999 Weder ........................ 341/101
6,437,725 B1 * 8/2002 Kwak ......................... 341/159

* cited by examiner

*Primary Examiner*—Brian Young
(74) *Attorney, Agent, or Firm*—Birch, Stewart, Kolasch & Birch, LLP

(57) ABSTRACT

A parallel to sequential message converter including a pair of signal terminals for receiving a first input signal having a duration of a first time period and a second input signal having a duration of a second time period which is less than the first time period, and wherein the second input signal is received concurrently with a portion of the first input signal so that a time overlap in signals exists. The first input signal is delayed at the onset of the second input signal for a period substantially equal to the time period of the second input signal. The second input signal is inserted into the signal stream at the start thereof and the delayed first input signal is thereafter reinserted so as to provide a sequential output of the first and the second input signals at an output terminal without a loss of any portion of the first input signal.

21 Claims, 3 Drawing Sheets

PARALLEL TO SEQUENTIAL MESSAGE CONVERTER

BACKGROUND OF THE INVENTION

1. Field of the Invention

This invention relates generally to electrical communication systems and more particularly to a communication system that processes and reformats real time analog video or digital message signals, received concurrently from multiple sources, into a sequence wherein no information is lost due to overlap or masking.

2. Description of Related Art

It is well known that in certain types of electrical communication systems, for example, systems which receive voice messages which overlap one another such as might be experienced by an aircraft dispatcher, some or part of one of the messages, typically the first message, is lost. It may be a key word or two or it may be several seconds of an important message that may be missed, with some very undesirable consequences resulting therefrom.

For example, in a real-time voice communication system where an air traffic controller is communicating with multiple aircraft on multiple frequency channels, the controller may receive an interfering message which is superimposed on an incoming transmission to which the controller is already listening. At the conclusion of the incoming transmission, the first message is resumed, but part of it has been lost.

Another example is where a dispatcher is receiving a voice transmission from a mobile unit, such as a police car or an ambulance. When a second unit transmits a message concurrently with the first received message, the second message is superimposed on the first and again, part of the first message may be lost.

Yet another example is where a hearing, such as a congressional or other type of hearing, is being conducted and broadcast. While testimony is being given, an announcer often must interject comments, such as who the speaker is or what is coming next, or simply to interject a station or network identification break. As a result, important comments may be lost because of the undesired disruption in the broadcast.

In all of these instances, information is undesirably lost to the detriment of the listener.

SUMMARY

Accordingly, it is an object of the invention to provide a communication system which concurrently process real-time information signals from multiple sources without a loss of information.

It is another object of the invention to provide a communication system which shifts incoming messages in near real-time as required to prevent overlap.

It is still a further object of the invention to provide a parallel to sequential message converter which automatically reformats superimposed messages in either digital video or analog communication channels to a sequential format and gradually returning to real-time transmission.

These and other objects are achieved by a parallel to sequential message converter including: a pair of signal input ports for receiving a first input signal having a duration of a first time period and a second input signal having a duration of a second time period, the second time period being less than the first time period, and wherein the second input signal is received concurrently with a portion of the first input signal so that a time overlap in signals exists; a signal output port; means for coupling the first input signal to the signal output port; means for delaying the first input signal at the onset of the second input signal for a period substantially equal to the second time period of the second input signal; and, means for coupling the second input signal to the signal output port at the start thereof and thereafter coupling the delayed first input signal to the output port so as to provide a sequential output of said first and said input signals without a loss of any portion of the first input signal.

The delay of the first input signal is provided by a refresh buffer memory having a controllable read out command and read out speed, and being operable such that the first message signal is read out of the memory at the end of the second message signal at an increased readout rate. In another aspect of the invention, the readout rate is increased through a frequency decimation method where both the first and second input signals are digitized, stored and sequentially combined. The output rate of the stored first input signal is increased by passing it through a decimation filter which comprises the bandwidth of the signal and then resamples the signal to reduce the total number of samples in the output so that when it is reproduced the bandwidth is restored.

Further scope of applicability of the present invention will become apparent from the detailed description provided hereinafter. It should be understood, however, that the detailed description and specific examples indicating the preferred embodiments of the invention are provided by way of illustration only, since various changes and modifications coming within the spirit and scope of the invention will become apparent to those skilled in the art from the detailed description.

BRIEF DESCRIPTION OF THE DRAWINGS

The present invention will become more fully understood when the detailed description provided hereinafter is considered together with accompanying drawings of the preferred embodiments, which are provided for purposes of illustration only and thus are not limitative of the present invention, and wherein.

DETAILED DESCRIPTION OF THE INVENTION

This invention is directed to a means for automatically reformatting superimposed messages in a communication channel to a sequential format so that no information is lost and is applicable not only to concurrently received analog signals, but also to overlapping data streams transmitted in digital form.

Figure 1:
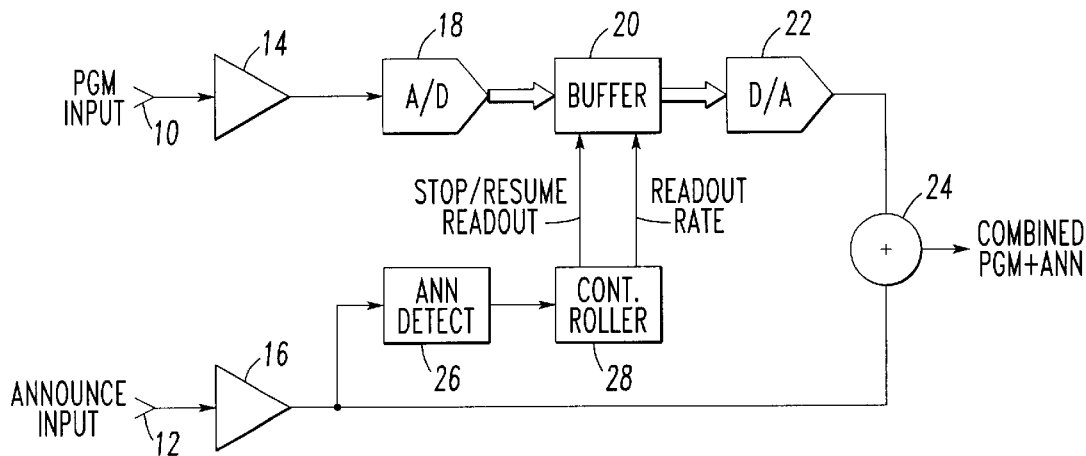
FIG. 1 is an electrical block diagram illustrative of a first embodiment of the invention.

Referring now to FIG. 1, shown thereat is a block diagram of the first embodiment of the invention including electrical apparatus for interleaving a pair of analog message information input signals and providing an output which is a combination of the two input signals, with the second signal being inserted into the first input signal without a loss of information.

As shown in FIG. 1, a pair of analog input signal ports 10 and 12 are provided for first and second audio message input signals, where the first received signal is applied to input port 10, while the second received input signal is applied to port 12. The first input signal may be comprised of, for example, an incoming relatively continuous program (PGM) from an audio source, not shown. During the reception of the first input signal, a second input appears which could be, for example, an important voice announcement. Both inputs are first fed to respective analog signal input amplifiers 14 and 16.

In the absence of the second input signal, the program (PGM) input is fed to an analog-to-digital (A/D) converter 18 via the amplifier 14 whose output is fed to a digital memory 20, such as a buffer memory, which is capable of storing a portion of the first input signal for a predetermined period. The buffer memory 20 is coupled to a digital-to-analog (D/A) converter 22 whose output is connected to a summing junction 24 along with the output of the second input amplifier 16. The output of the input amplifier 16 is also connected to a signal detector 26 which detects the occurrence of the second input signal being applied to the second input port 12. The detector circuit 26 is connected to a controller 28 for controlling the starting and stopping of the readout from the buffer memory 20 as well as the readout rate.

In the absence of any second input signal, there is no delay in the signal flow of the first input signal and the contents of the buffer memory 20 is read out at the same time as it is read in and there is no delay in the first signal being outputted from the summing junction 24. On the other hand, when a second input signal is input during the course of the first input signal, the read out function of the buffer memory 20 is halted and the second input signal is inserted in the output by being fed to the summing junction 24. When the second signal terminates, the readout of the buffer memory 20 is restarted at the same place as it was halted. However, the readout speed, i.e., the clock rate, is increased slightly so that after a relatively short time, the delay in the output of the first input signal will be reduced to zero and will once again be in real time until the occurrence of another second input signal.

A typical example of the first and second analog input signals comprises, for example, an incoming program consisting of voice message signal of hearing testimony being broadcast. When an announcement is interjected, the two input signals would overlap one another so that a portion of the testimony, i.e. first input signal, would be masked or otherwise altered by the second input signal so that a portion of the testimony would be lost.

With the arrangement as shown in FIG. 1, in absence of an interjected announcement, the signal of the testimony is read out at the same time as it is read in and there is no delay in the program output. However, when an announcement signal is received, the readout function of the buffer memory 20 and the testimony output is halted, but continues to be stored in the memory 20 until such time that the announcement is concluded, whereupon the read-out buffer is restarted in the same place that the testimony readout was halted. Where, for example, the buffer memory 20 is capable of storing a period of testimony of up to 1.0 minute and a short announcement having a period, for example, 5.0 sec. occurs, the pitch change after resuming the testimony output is not noticeable. This is true as long as the catch-up time period of the testimony is not too short. The following example is offered to demonstrate this feature.

For example, at t=0 testimony is interrupted for an inserted announcement. Up to this point, the testimony has been delivered to the program output in real time. The announcement is now delivered to the program output while the testimony part is interrupted. At t=5 sec., the announcement is over and the testimony is resumed from the point where it was interrupted; however, it is now 5 sec. late. To compensate for this, the readout speed of the buffer memory 20 is increased by 5% by the controller 28, which is equivalent to a voice pitch change of about 1 semitone, which, for example, is the difference in pitch between C and C#. Perceptually, it is a small change in the sound of the speech. At t=100 sec., the readout of the buffer 20 has "caught up" to the writing function and is now back to real time. The formerly overlapping announcement has now been inserted as a separate piece of the sequence without the loss of information in the testimony.

Figure 2A:
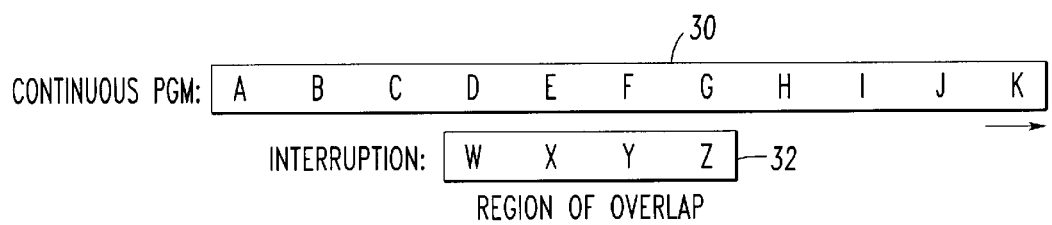
FIGS. 2A and 2B are diagrams illustrative of the shifting of incoming messages in time in accordance with the subject invention to prevent overlap.
Figure 2B:
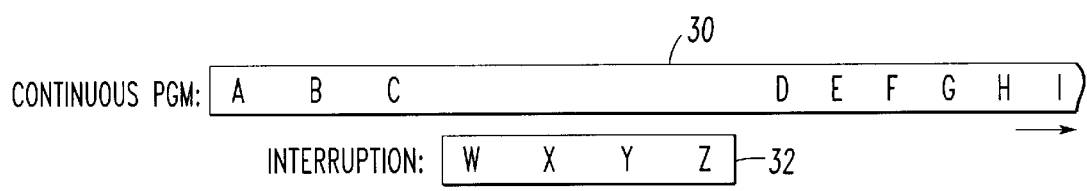

This is further illustrated in FIGS. 2A and 2B where reference numeral 30 represents a continuous program data stream consisting of a sequence of PGM bits a, b, . . . j, k, while reference numeral 32 represents an announcement message consisting of a sequence of interruption bits w, x, y, and z. As shown, a region of overlap occurs between bits d, e, f, g and w, x, y, z. FIG. 2B represents an interruption of the sequence 30 after bit c, with bits w, x, y of sequence 32 being serially inserted before bit d.

While the structure shown in FIG. 1 comprises a digital embodiment of the invention which implements the sequencer functions where a continuous first message input signal has paused and then catches up after a second relatively short overlapping second message input signal has been inserted, FIGS. 3A–3D are illustrative of a purely analog system for providing the same parallel to sequential signal conversion. There a continuous loop of audio recording tape shown by reference number 34 is located in a tape system 36 which includes conventional erase, (E), record (R) and play (P) heads 38, 40 and 42 as well as a pair of capstan and pressure roller assemblies 50 and 52.

Figure 3A:
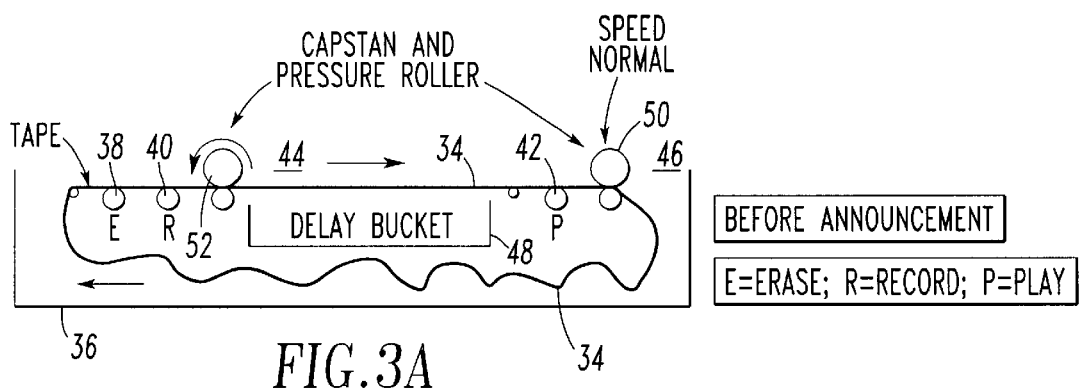
FIGS. 3A–3D are illustrative of a second embodiment of the invention and its operation.

FIG. 3A discloses the tape system 36 before the occurrence of a second message input signal, e.g., an announcement. During this period, the first message signal, e.g., a continuous program, is recorded on the tape loop 34 using the record head 40 and immediately played back using the play head 42. There is a finite delay because of the distance between the heads 40 and 42, which is a function of tape speed; however, this normal delay is ignored and is assumed to be "real time" for an interruption sequence which will now be described.

Figure 3B:
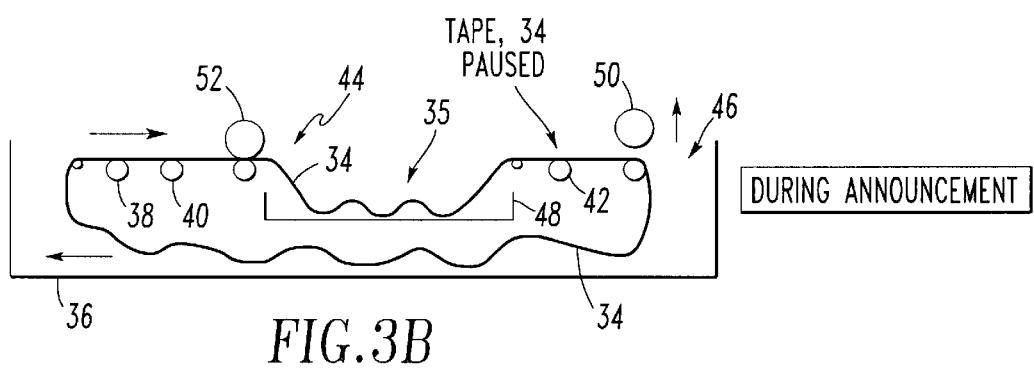

Referring now to FIG. 3B, when the first message input signal is to interrupted, for example by the insertion of a second message input signal, the right capstan roller 50 of the capstan assembly 46 is lifted and the tape 34 over the play head 42 stops. The tape between the two heads 40 and 42 loops and accumulates, as shown by reference numeral 35, in a delay bucket 48 because the left capstan roller 52 is not lifted and recording of the voice message continues. During this period, the second message input signal is fed to the output.

Figure 3C:
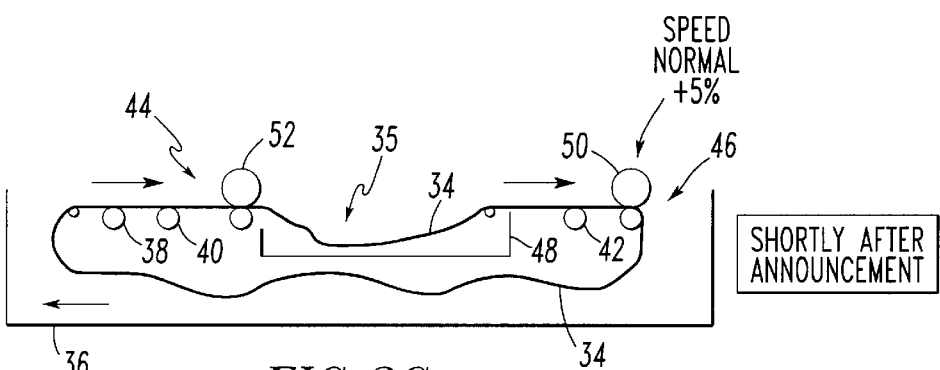

When the interruption terminates and the second message is finished, the right capstan roller 50 drops and the recorded first message signal resumes from the point where it was interrupted as shown in FIG. 3C. At this point, it is running late by an amount equal to the period of interruption, say for example, 5 seconds. The speed of the right capstan roller 50 is now increased by 5% and the accumulated tape loop portion 35 between capstan rollers 50 and 52 gradually shortens, as shown.

Figure 3D:
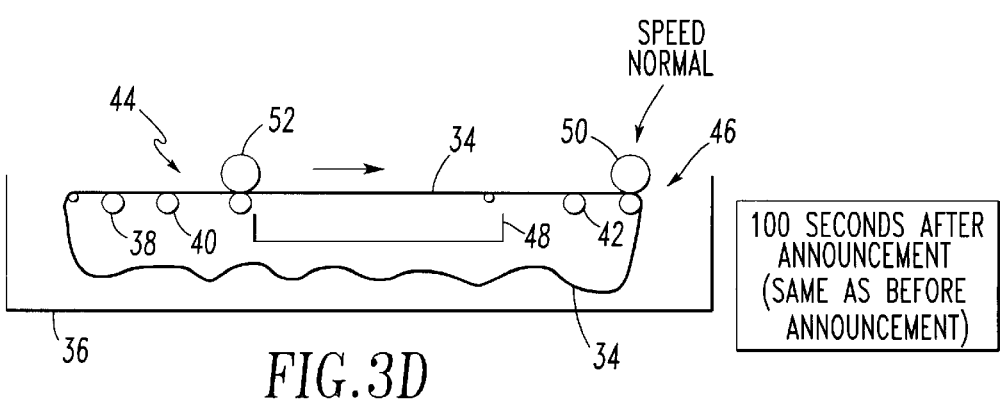

In FIG. 3D, after, for example, 100 sec., the loop portion 35 is eliminated and the right capstan roller 50 resumes normal speed and the first message signal input is again in real time.

In the two embodiments referred to above, it is necessary to "speed up" the first message signal after inserting the second message signal because the incoming message is continuous without gaps.

Figure 4:
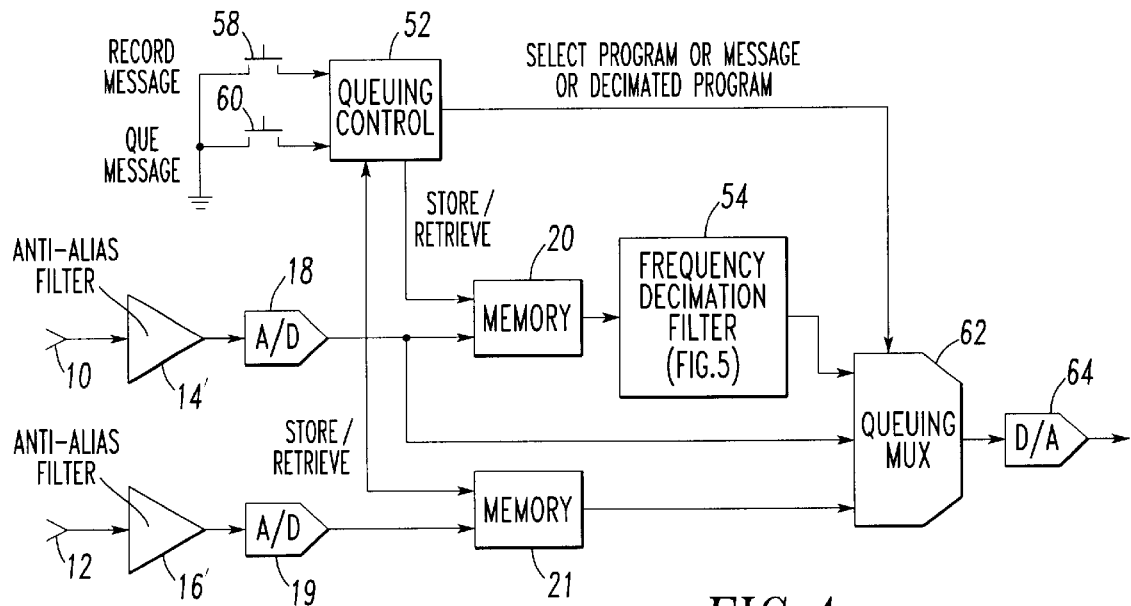
FIG. 4 is an electrical block diagram of a third embodiment of the subject invention.
Figure 5:
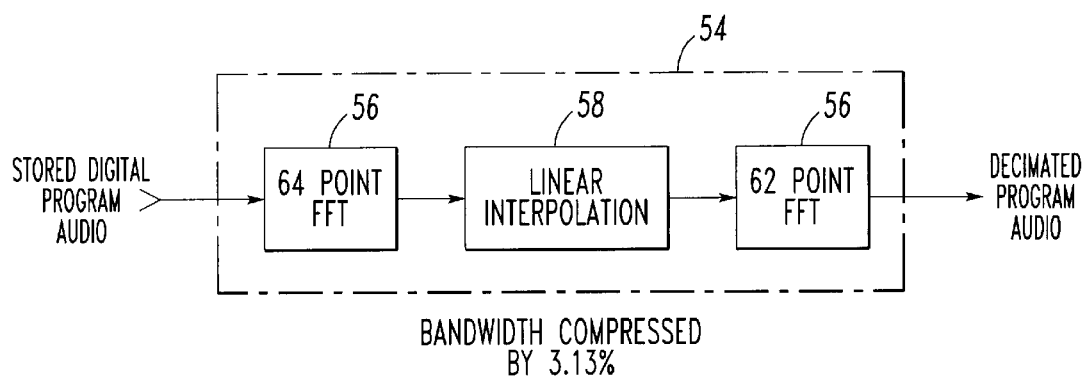
FIG. 5 is an electrical block diagram illustrative of the frequency decimation filter included in the embodiment shown in FIG. 4.

A variation of the digital embodiment shown in FIG. 1 is shown in FIG. 4 and comprises a parallel to sequential message converter where a few samples in the buffer memory 20 are intentionally dropped periodically upon reading the incoming first message signal. For example, ignoring every 9th sample would speed-up the play back or output by 10% without changing pitch. The technique shown in FIG. 4 uses, among other things, a frequency decimation filter 54 which is shown in FIG. 5 comprising a 64 point fast fourier transform (FFT) section 56, a linear interpolation section 58, and a 62 point inverse fast fourier transform (IFFT) section 60.

In addition to the frequency decimation filter 54, the apparatus shown in FIG. 4 includes input amplifiers 14' and 16' having anti-alias filters included therein connected to the input ports 10 and 12. The apparatus also includes a second analog-to-digital (A/D) converter 19 so that not only is the continuous first message signal converted to a digital signal in the A/D converter 18, but also the second short message signal is converted to a digital signal in a second A/D converter 19. Also, a second digital memory 21 is utilized to temporarily store the short second message signal along with the continuous first message signal which is stored in the memory 20. Additionally, a cueing control circuit 56 is used to control the memories 20 and 21. The cueing control circuit 56, moreover, has a pair of manually operated switches 58 and 60 connected thereto for record and cue selection for the second message signal memory 21. A cueing multiplexer (MUX) 62 is coupled to the frequency decimation filter 54, the output of the A/D converter 18 and the second message memory 21 and operates from a control signal from the cueing control circuit 56 for selecting either the continuous first message signal which may be, for example, an audio program, the second message signal which may be, for example, an audio announcement message, or a decimated message signal, to be subsequently explained. The output of the cueing multiplexer is connected to a digital-to-analog (D/A) converter 64 for outputting a serial analog signal output of the input signals.

In the frequency decimation method, both the first and second analog input signals are digitized so that the two signals can be stored and combined digitally. After the operator records the short second message signal in the digital storage memory 21, it is cued for insertion into the first message signal. Just as in the first embodiment of the invention shown in FIG. 1, a gap is created in the continuous message signal and the second relatively short message signal is added to it by storing and delaying the output thereof. After output of the second message signal is complete, the remainder of the stored first message signal is fed to the output, with the output rate of the stored first message signal being increased by passing it through the decimation filter 54.

The frequency decimation filter 54 compresses the bandwidth of the first message signal and then resamples it to reduce the total number of samples. When the samples are replayed at the original sample rate, the bandwidth is restored. This method preserves the original frequency of both the first and second message signals; however, the first message signal will be presented at a slightly faster rate. Where the first and second message signals are comprised of audio signals, the rate of the output increase is fixed and is tailored for each application based upon the audio fidelity requirements. The length of the second message signal determines the period over which the output rate must be increased. In a typical system, a rate increase of 3.13% would require 32 seconds of rate increase for every second of inserted message.

The implementation of the decimation filter 54 shown in FIG. 5 effectively increases the data output rate without altering the frequency content of the original message. If, for example 64 samples of data are collected and a 64-point FFT is calculated, after the bandwidth has been compressed, a 62-point inverse FFT is performed which reduces the total number of samples to 96.87% of the input. Since the sample rate of the input and output data is the same, the time required to output the data is shortened. The bandwidth of the data is compressed by the same factor as the sample reduction by a linear interpolation process. The linear interpolation reduces the bandwidth from 64-points to 62-points by linearly scaling the amplitude of each frequency sample. It must be noted that the upper and lower half of the data in the frequency domain is redundant so the interpolation process can use the same method for both the upper and lower halves. For example, for the upper 32-points, the following interpolation is used:

For an input to the interpolation: $A=A(n)$, n=0 to 31

The result is: $A_r=A(31/30)m$, m=0 to 30

Since the amplitude of the n=31 frequency is assigned to the m=30 frequency sample, the bandwidth has been compressed by one frequency sample. However, since the output rate of the resulting samples is converted back to an analog signal at the original input sample rate, the bandwidth of the original message is restored. Both the size of the FFT and the amount of compression must be selected to meet the required fidelity of the resulting audio program. Non-linearities will also be created if the samples for the 64-point FFT are not overlapped. In some cases, the non-linearities will be small enough to be tolerated, while in other cases, a 25% sample overlap may be required.

Thus what has been shown and described is a parallel to sequential message converter which is particularly useful in connection with a relatively continuous audio or voice (first) message and a relatively short audio or voice (second) message which is inserted in the first message without any information being lost, due to the time shifting nature of the apparatus. Besides audio signals, video signals and other types of data streams subject to interruption may also be adjusted in times/or speed so that no data is lost. Although message type signals have been used to illustrate the invention, non-message signals may also be employed such as a telephone ring or other type of noise interruption which would be treated as trigger signals for starting the delay in the read-out process. The message buffer memory 21 can also be used as a "renewing archive" and replayed upon command or saved to an archive file.

The invention shown and described herein is particularly applicable to air traffic controllers and dispatchers of mobile units as well as various types of broadcast which, while being continuous, need to be interrupted periodically without the loss of information content.

Having thus shown and described what are at present considered to be the preferred embodiments of the invention, it should be noted that the same has been made by way of illustration and not limitation. Accordingly, all alterations, modifications and changes coming within the scope of the appended claims are meant to be included.

What is claimed:

1. A parallel to sequential signal converter, comprising:
a pair of signal input ports for receiving a first input signal having a duration of a first time period and a second input signal having a duration of a second time period, the second time period being less than the first time period, and wherein the second input signal is received concurrently with a portion of the first input signal so that a time overlap in signals exists;
a signal output port;
means for coupling the first input signal to the signal output port;
means for delaying the first input signal at the onset of the second input signal for a period substantially equal to the second time period of the second input signal; and
means for coupling the second input signal to the signal output port at the start thereof and thereafter coupling the delayed first input signal to the output port so as to provide a sequential output of said first and said input signals without a loss of any portion of the first input signal.

2. The signal converter according to claim 1 wherein said first and second input signals comprise analog or digital input signals.

3. The signal converter according to claim 1 wherein said first and second input signals are comprised of analog signals.

4. The signal converter according to claim 3 wherein said first and second analog input signals are comprised of audio signals.

5. The signal converter according to claim 1, wherein said means for delaying includes an analog to digital signal converter connected to the first input signal, a digital memory connected to analog to digital signal converter for storing a portion of the first input for the time period of the second input signal, and a digital to analog signal converter for converting the stored portion of the first input signal back to an analog signal for coupling to the signal output port.

6. The signal converter according to claim 5 and additionally including circuit means for controlling the digital memory so as to provide a controlled start and stop of memory readout.

7. The signal converter according to claim 6 wherein said means for controlling the digital memory also controls readout speed.

8. The signal converter according to claim 6 wherein the first input signal comprises an audio signal and the readout speed is controlled so as to be greater than a normal reading speed for restoring signal fidelity to the first input signal upon readout.

9. The signal converter according to claim 8 and additionally including a signal summer at the output port.

10. The signal converter according to claim 8 wherein the second input signal also comprises an audio signal.

11. The signal converter according to claim 10 wherein one or both of said first and second audio input signals include a voice message.

12. The signal converter according to claim 1 wherein said means for delaying the first input signal includes a tape system including a length of recording tape for recording and playing back a portion of the first input signal for the time period of the second input signal.

13. The signal converter according to claim 5 and additionally including a decimation filter connected to the digital memory for providing a decimated digital output signal of the stored portion of the first input signal to the digital to analog converter at an increased output rate.

14. The signal converter according to claim 13 and additionally including another analog to digital converter connected to the second input signal for providing a digital output signal of the second input signal; and
a digital signal combiner connected between said another analog to digital converter and the decimation filter.

15. The signal converter according to claim 14 wherein the digital signal combiner comprises a multiplexer.

16. The signal converter according to claim 13 wherein the decimation filter includes a first circuit for providing n point fast fourier transform, a second circuit for providing a linear interpolation and a third circuit for providing m point inverse fast fourier transforms, and where n and m are integers.

17. A method of automatically reformatting superimposed message signals to a sequential format in a communications channel so that no information is lost due to masking, comprising the steps of:
interrupting one of said message signals being fed to an output at the start of another of said message signals;
storing an overlapping portion of said one message signal for a period equal to the duration of said another message signal;
inserting and feeding said another message signal to the output during said storing step;
thereafter feeding the stored portion of said one message signal along with a continuation thereof to said output at the termination of said another message signal.

18. The method of claim 17 wherein said step of storing includes,
converting said one message signal to a digital signal, storing the digital signal in a memory and,
wherein said step of feeding the stored portion includes reading the stored signal out of the memory and converting the digital signal read out to an analog signal.

19. The method of claim 18 wherein the step of reading the stored signal out of the memory includes the steps of reading out for a predetermined time at a rate greater than a readin rate.

20. The method of claim 18 and additionally including the step of periodically dropping a predetermined number of samples of said one message signal during the storing step so as to speed up the feeding of said one message to said output at the conclusion of said another message signal.

21. The method of claim 18 wherein the output rate of the stored signal is increased by passing it through a decimation filter which comprises the bandwidth of the signal and then resamples the signals to reduce the total number of samples in the output whereupon the bandwidth is restored upon being read out at a normal rate.

* * * * *